(12) United States Patent  
Choi et al.

(10) Patent No.: US 8,057,725 B2
(45) Date of Patent: Nov. 15, 2011

(54) CAPILLARY IMPRINTING TECHNIQUE

(75) Inventors: Byung-Jin Choi, Austin, TX (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 13/028,336

(22) Filed: Feb. 16, 2011

(65) Prior Publication Data

US 2011/0140302 A1 Jun. 16, 2011

Related U.S. Application Data

(63) Continuation of application No. 12/707,365, filed on Feb. 17, 2010, now Pat. No. 7,910,042, which is a continuation of application No. 12/026,049, filed on Feb. 5, 2008, now Pat. No. 7,708,926, which is a continuation of application No. 11/127,041, filed on May 11, 2005, now Pat. No. 7,727,453, which is a continuation of application No. 10/645,306, filed on Aug. 21, 2003, now Pat. No. 7,442,336, which is a continuation of application No. 10/194,991, filed on Jul. 11, 2002, now Pat. No. 7,077,992, said application No. 12/026,049 is a continuation of application No. 11/565,393, filed on Nov. 30, 2006, now Pat. No. 7,691,313, which is a continuation of application No. 11/389,731, filed on Mar. 27, 2006, now Pat. No. 7,224,443, which is a continuation of application No. 10/293,224, filed on Nov. 13, 2002, now Pat. No. 7,019,819.

(60) Provisional application No. 60/748,380, filed on Dec. 8, 2005.

(51) Int. Cl.
  *B29C 41/12* (2006.01)
  *B81C 1/00* (2006.01)
(52) U.S. Cl. .................................................. 264/319
(58) Field of Classification Search .................. 264/319
  See application file for complete search history.

(56) References Cited

U.S. PATENT DOCUMENTS 7,442,336 B2 * 10/2008 Choi et al. ............... 264/319 X
7,708,926 B2 * 5/2010 Choi et al. ................. 264/319
7,910,042 B2 * 3/2011 Choi et al. ................. 264/319

* cited by examiner

*Primary Examiner* — Leo B Tentoni
(74) *Attorney, Agent, or Firm* — Cameron A. King

(57) ABSTRACT

The present invention provides a method for patterning a substrate with a template having a mold that features positioning conformable material between the substrate and the mold and filling a volume defined between the mold and the substrate with the conformable material through capillary action between the conformable material and one of the mold and the substrate. Thereafter, the conformable material is solidified. Specifically, the distance between the mold and the substrate is controlled to a sufficient degree to attenuate, if not avoid, compressive forces between the mold and the substrate. As a result, upon initial contact of the mold with the conformable material, capillary filling of the volume between the mold and the substrate occurs.

17 Claims, 6 Drawing Sheets

CAPILLARY IMPRINTING TECHNIQUE

CROSS-REFERENCE TO RELATED APPLICATIONS

The present application is a continuation of U.S. patent application Ser. No. 12/707,365, now U.S. Pat. No. 7,910,042, filed Feb. 17, 2010. U.S. patent application Ser. No. 12/707,365 is a continuation of U.S. patent application Ser. No. 12/026,049, now U.S. Pat. No. 7,708,926, filed Feb. 5, 2008; which is a continuation of U.S. patent application Ser. No. 10/645,306, now U.S. Pat. No. 7,442,336, filed Aug. 21, 2003; and a continuation of U.S. patent application Ser. No. 11/127,041, now U.S. Pat. No. 7,727,453, filed May 11, 2005. U.S. patent application Ser. No. 11/127,041 is a continuation of U.S. patent application Ser. No. 10/194,991, now U.S. Pat. No. 7,077,992, filed on Jul. 11, 2002; and is also a continuation of U.S. patent application Ser. No. 11/565,393, now U.S. Pat. No. 7,691,313, filed on Nov. 30, 2006. U.S. patent application Ser. No. 11/565,393 claims priority to U.S. provisional application 60/748,380 filed on Dec. 8, 2005, and is also a continuation of U.S. patent application Ser. No. 11/389,731, now U.S. Pat. No. 7,224,443, filed on Mar. 27, 2006. U.S. patent application Ser. No. 11/389,731 is a continuation of U.S. patent application Ser. No. 10/293,224, now U.S. Pat. No. 7,019,819, filed on Nov. 13, 2002. All of the aforementioned patent applications and patents are incorporated herein by reference.

BACKGROUND OF THE INVENTION

The field of invention relates generally to micro-fabrication of structures. More particularly, the present invention is directed to patterning substrates in furtherance of the formation of structures.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing a reduction in the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al., which is incorporated herein by reference. Willson et al. disclose a method of forming a relief image in a structure. The method includes having a mold make mechanical contact with the polymerizable fluid disposed on a substrate. The mold includes a relief structure. Under the compressive force created between the mold and substrate, the polymerizable fluid fills the relief structure in the mold. Thereafter, the polymerizable fluid is subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The post processing steps are undertaken to transfer the relief image into the substrate.

To accurately form the pattern in the polymeric material, sufficient time and force is employed to ensure that the relief structure is completely filled while controlling the distribution of the polymerizable fluid over the substrate. For example, to decrease the time required to imprint a polymerizable fluid with a given viscosity, involves increasing the compressive force between the mold and the substrate. However, too great a compressive force results in the polymerizable fluid spreading to undesired regions of the substrate. Conversely, to obtain precise control over the distribution of the polyermizable fluid over the substrate, often involves decreasing the compressive force between the mold and the substrate. As a result, the time required to imprint the polymerizable material increases. Thus, a tradeoff exists between compressive force employed and time required to imprint the polymerizable fluid.

A need exists, therefore, to reduce the time required to pattern polymerizable fluid while maintaining adequate control of the distribution of the polymerizable fluid over the surface of the substrate.

SUMMARY OF THE INVENTION

The present invention provides a method for patterning a substrate with a template having a mold that features positioning conformable material between the substrate and the mold and filling a volume defined between the mold and the substrate with the conformable material through capillary action between the conformable material and one of the mold and the substrate. Thereafter, the conformable material is solidified. Specifically, the movement between the mold and the substrate is controlled to a sufficient degree to attenuate, if not avoid, compressive forces between the mold and the substrate. As a result, upon initial contact of the mold with the conformable material, spontaneous capillary filling of the volume between the mold and the substrate occurs. The capillary filling creates pulling forces between the mold and the substrate, which is referred to as a negative imprint force. Many benefits result from the negative imprint force, including rapid and complete filling of the features of the mold, as well as precise control of the distribution of the conformable material of the substrate. These and other embodiments are described more fully below.

DETAILED DESCRIPTION OF THE INVENTION

Figure 1:
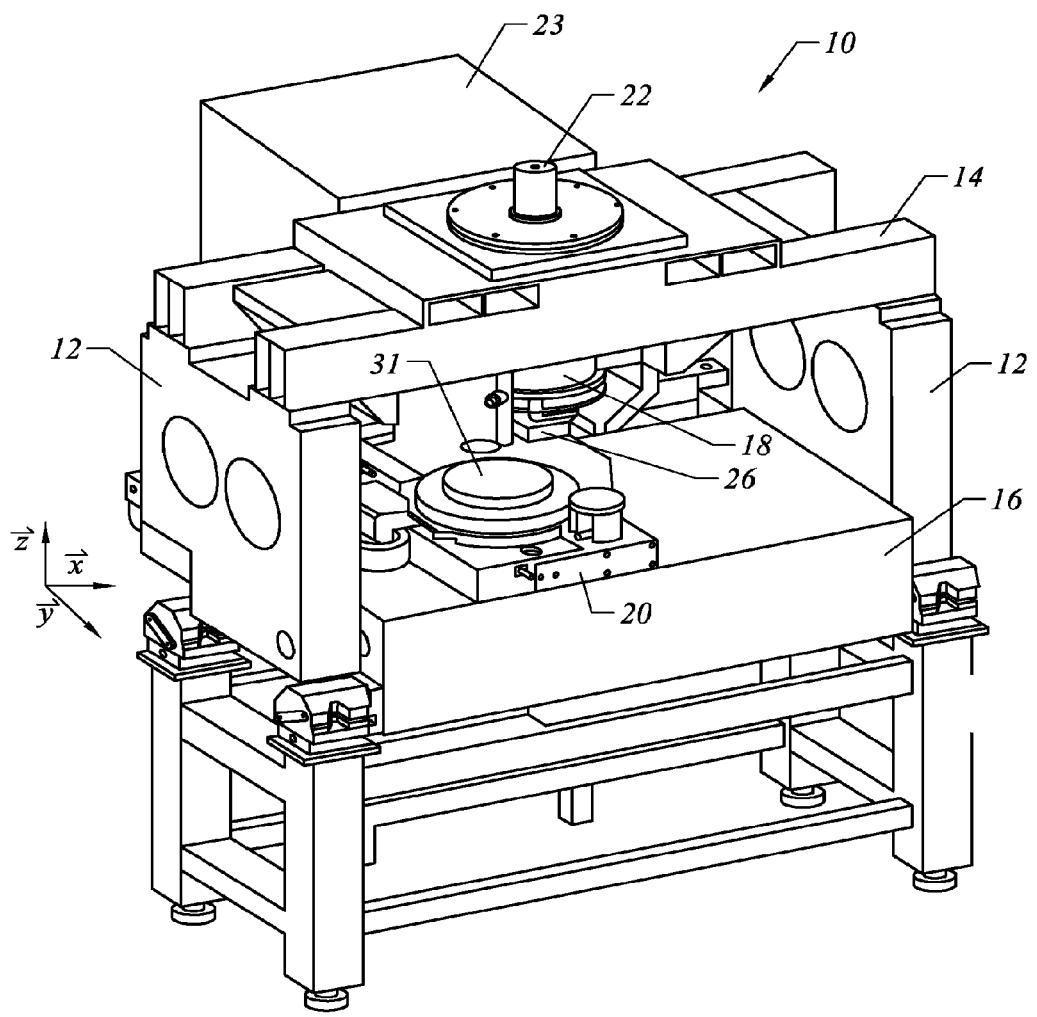
FIG. 1 is a perspective view of a patterning system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes, and may optionally facilitate movement along a Z axis, as well. A radiation source 22 is coupled to lithographic system 10 to impinge actinic radiation upon motion stage 20. As shown, radiation source 22 is coupled to bridge 14 and includes a power generator 23 connected to radiation source 22.

Figure 2:
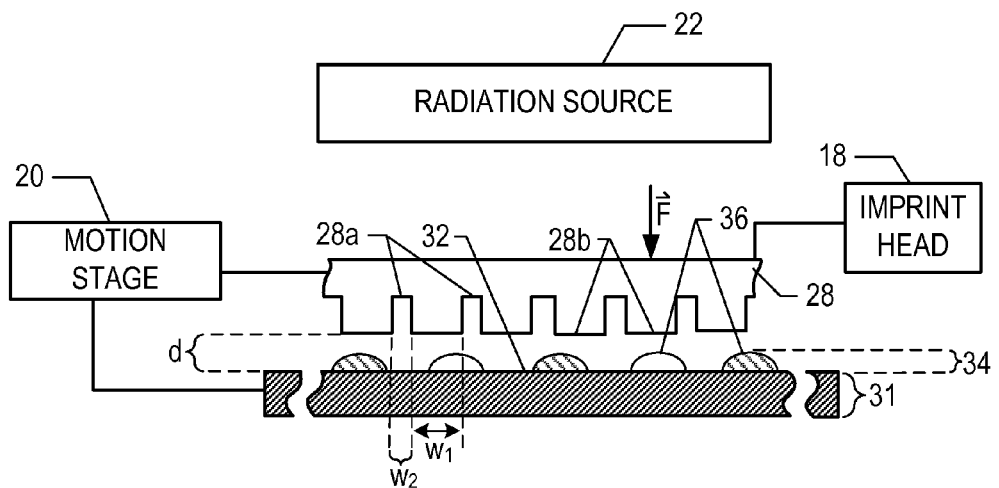
FIG. 2 is a simplified elevation view of a patterning system shown in FIG. 1.
Figure 13:
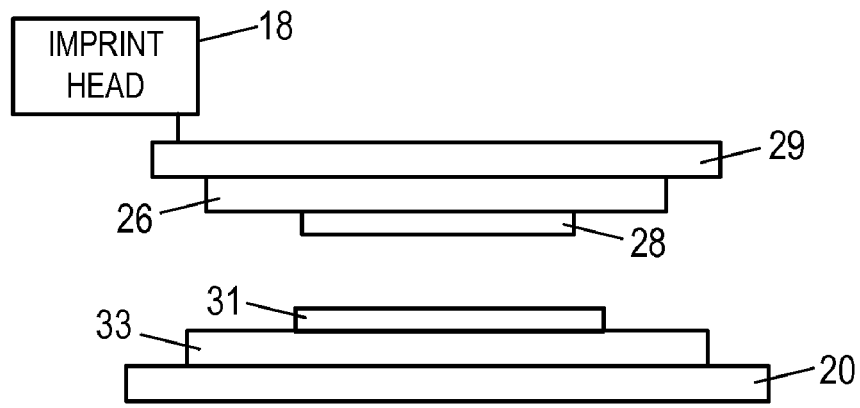
FIG. 13 is a simplified side view of a portion of the system show in FIG. 1.

Referring to both FIGS. 1, 2, and 13, system 10 may comprise a template 26 having a mold 28 thereon. Mold 28 includes a plurality of features defined by a plurality of spaced-apart recessions 28a and protrusions 28b. The plurality of features defines an original pattern that is to be transferred into a substrate 31. Template 26 may be coupled to a template chuck 29, template chuck 29 being any chuck including, but not limited to, air cavity, vacuum, pin-type, groove-type, or electromagnetic, as described in U.S. Pat. No. 6,873,087 entitled "High-Precision Orientation Alignment and Gap Control Stages for Imprint Lithography Processes" and U.S. Pat. No. 7,019,819, entitled "Chucking System for Modulating Shapes of Substrate"; both of which are incorporated herein by reference. Further, template chuck 29 may be coupled to imprint head 18 to facilitate movement of template 26, and therefore, mold 28.

Substrate 31 may comprise of a bare wafer or a wafer with one or more layers disposed thereon. Substrate 31 may be coupled to a substrate chuck 33, substrate chuck 33 being any chuck including, but not limited to, air cavity, vacuum, pin-type, groove-type, or electromagnetic, as described in U.S. Pat. No. 6,873,087. Substrate 31 and substrate chuck 33 may be supported upon motion stage 20.

To that end, imprint head 18 is adapted to move along the Z axis and vary a distance "d" between mold 28 and substrate 31. In this manner, the features on mold 28 may be imprinted into a conformable region of substrate 31, discussed more fully below. Radiation source 22 is located so that mold 28 is positioned between radiation source 22 and substrate 31. As a result, mold 28 is fabricated from material that allows it to be substantially transparent to the radiation produced by radiation source 22.

Figure 3:
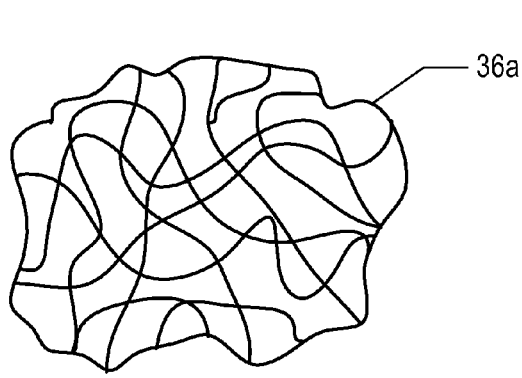
FIG. 3 is a simplified representation of material from which an imprinting layer, shown in FIG. 2, is comprised before being polymerized and cross-linked.

Referring to both FIGS. 2 and 3, a conformable region, such as an imprinting layer 34, is disposed on a portion of surface 32 that presents a substantially planar profile. It should be understood that the conformable region may be formed using any known technique to produce conformable material, such as a hot embossing process disclosed in U.S. Pat. No. 5,772,905 to Chou, which is incorporated by reference in its entirety herein, or a laser assisted direct imprinting (LADI) process of the type described by Chou et al. in *Ultrafast and Direct Imprint of Nanostructures in Silicon*, Nature, Col. 417, pp. 835-837, June 2002. In the present embodiment, however, conformable region consists of imprinting layer 34 being deposited as a plurality of spaced-apart discrete droplets 36 of imprinting material 36a on substrate 31, discussed more fully below. Imprinting layer 34 is formed from imprinting material 36a that may be selectively polymerized and cross-linked to record a pattern that is complementary to the original pattern, defining a recorded pattern. Imprinting material 36a is shown in FIG. 4 as being cross-linked at points 36b, forming cross-linked polymer material 36c.

Figure 4:
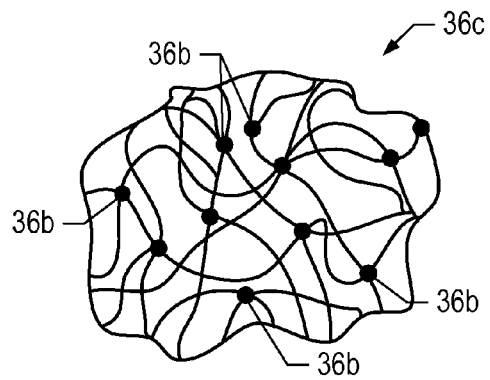
FIG. 4 is a simplified representation of cross-linked polymer material into which the material shown in FIG. 3 is transformed after being subjected to radiation.

Referring to FIGS. 2, 3 and 4, after a desired distance "d" has been reached, radiation source 22 produces actinic radiation that polymerizes and cross-links imprinting material 36a, forming polymer material 36c in which a substantial portion thereof is cross-linked. As a result, imprinting material 36a transforms to polymer material 36c, which is a solid, forming imprinting layer 134, shown in FIG. 5. Specifically, polymer material 36c is solidified to provide side 34c of imprinting layer 134 with a shape conforming to a shape of a surface 28c of mold 28, with imprinting layer 134 having recesses 30. After imprinting layer 134 is transformed to consist of polymer material 36c, shown in FIG. 4, imprint head 18, shown in FIG. 2, is moved to increase distance "d" so that mold 28 and imprinting layer 134 are spaced-apart.

Figure 5:
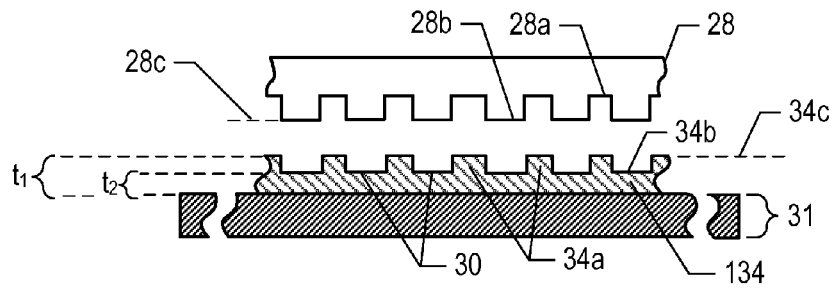
FIG. 5 is a simplified elevation view of a mold spaced-apart from the imprinting layer, shown in FIG. 2, after patterning of the imprinting layer.

Referring to FIGS. 2, 3 and 5, the pattern recorded in imprinting layer 34 may be produced primarily, if not solely, by capillary force of imprinting material 36a with mold 28 and/or substrate 31. The amount of external force, i.e., non-capillary pressure, employed is dependent upon several factors, including the composition of imprinting material 36a, the resulting thickness of imprinting layer 34 and the area over which imprinting material 36a must spread. For example, a fixed composition of imprinting material 36a and a fixed area over which imprinting material 36a is to spread, there is a minimum distance d' between substrate 31 and protrusions 28b that is reached before capillary filling occurs. Were thickness $t_2$ of imprinting layer 34 greater than d' very little capillary pressure would be employed to spread imprinting material 36a, i.e., a greater amount of compressive forces would be exerted on mold 28. In that case, an external positive force F is employed to spread imprinting material 36a in droplets 36 in a desirable amount of time. In this manner, imprinting material 36a in droplets 36 is spread primarily with external pressure applied thereto via mold 28 a sufficient amount until imprinting material 36a is spread between mold 28 and substrate 31, as desired.

Assuming, for the fixed area and fixed composition of imprinting material 36a, that $t_2$ is less than or equal to d', the amount of capillary pressure becomes primarily a function of thickness $t_2$ and the fraction of the fixed area to be filled with imprinting material 36a, i.e., the portion of the fixed area upon which imprinting material 36a is absent. More particularly, the amount of capillary pressure generated during imprinting is proportional to the fraction of the fixed area to be filled and inversely proportional to thickness $t_2$. Understanding that thickness $t_2$ is dependent upon distance d, it becomes important to carefully control distance d during the imprinting process. Control of distance d may be frustrated by compliance in imprint head 18 and/or motion stage 20. In this situation, rapid capillary filling occurs upon contact of droplets 36 with mold 28. Specifically, relative movement between mold 28 and substrate 31 is controlled so that distance d decreases to place surface 28c of mold 28 in contact with droplets 36. Contact with surface 28c of mold 28 distorts the hemispherical shape of droplets 36, causing the same to initiate wetting/spreading across surface 28c of mold 28, as well as over surface 32 of substrate 31. The distance d continues to decrease until a volume V is defined between mold 28 and the region of substrate 31 in superimposition therewith fills with imprinting material 36a through capillary action.

Figure 6:
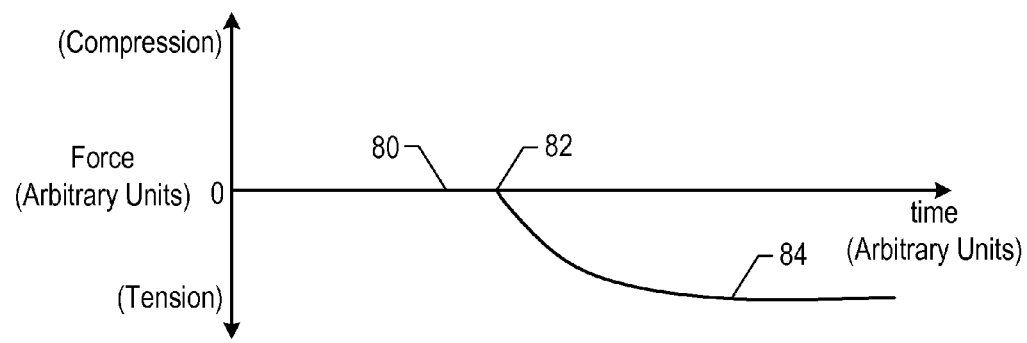
FIG. 6 is a graphical representation of the forces to which a mold, shown in FIG. 2 is subjected during imprinting processes.

Referring to FIGS. 2 and 6, force measurements on mold 28 during an exemplary capillary imprint method is shown with point 80 wherein droplets 36 are initially contact with mold. As shown, the compressive and tensile forces to which mold 28 is subjected are substantially zero. At point 82, capillary filling of volume V is initiated so that mold 28 is subjected to tension force T. A point 84, tension force T has reached a maximum magnitude, i.e., substantially all of imprinting material 36a in volume V is undergoing capillary attraction with mold 28 and substrate 31.

Figure 7:
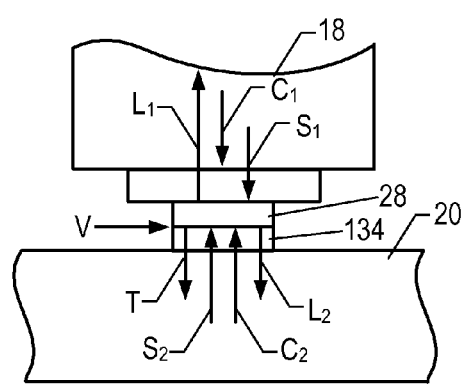
FIG. 7 is a detailed view of the system shown in FIG. 1.

Specifically, relative movement of mold 28 and substrate 31 is effectuated to attenuate, if not avoid, subjecting mold 28 to compressive forces resulting from contact with imprinting material 36a. The compressive forces $C_1$ and $C_2$, shown in FIG. 7, that are sought to be minimized result from imprint head 18 pushing against mold 28 as imprinting material 36a pushes against mold 28 during imprinting. This facilitates spontaneous capillary filling of volume V occurring upon initial contact of mold 28 with imprinting material 36a in droplets 36. The capillary filling creates pulling/tensional forces, T, upon mold 28, referred to as a negative imprint force. The negative imprinting force, or tension force, T causes elongation of imprint head 18 and substrate 31 subjecting mold 28 to tension force T.

However, too great a negative imprint force may compromise control of imprinting layer 134 thickness uniformity. It is has been found desirable to minimize the amount of negative imprint force present when attempting to achieve maximum thickness uniformity. To that end, movement between mold 28 and substrate 31 is effectuated to maximize thickness uniformity of imprinting layer 134, i.e., to ensure that $t_1$ is uniform over the area of imprinting layer 134 and that $t_2$ is uniform over the area of imprinting layer. This is achieved by minimizing the magnitude and/or time that mold 28 is subjected to compressive forces $C_1$ and $C_2$ and tension force T. To that end, pushing forces $S_1$ and/or $S_2$, as well as pulling forces $L_1$ and/or $L_2$, may be employed to compensate for the presence of compressive forces $C_1$ and $C_2$ and tension force T.

Specifically, imprint head 18 would apply pulling force $L_1$ to attenuate, if not nullify, compressive forces $C_1$ and $C_2$. Alternatively, motion stage 20 would generate pulling force $L_2$ to attenuate, if not nullify, compressive forces $C_1$ and $C_2$ or imprint head 18 and motion stage 20 could move in conjunction with one another to attenuate or nullify forces $C_1$ and $C_2$. In a similar fashion, imprint head 18 could apply pushing force $S_1$ to attenuate, if not nullify, tension force T and/or motion stage 20 would generate pulling force $L_2$ to attenuate, if not nullify, tension force T. In this manner, the magnitude of tensile and/or compressive forces may be controlled as desired in order to maximize imprinting layer 134 thickness uniformity while still obtaining a desired distance d.

Figure 14:
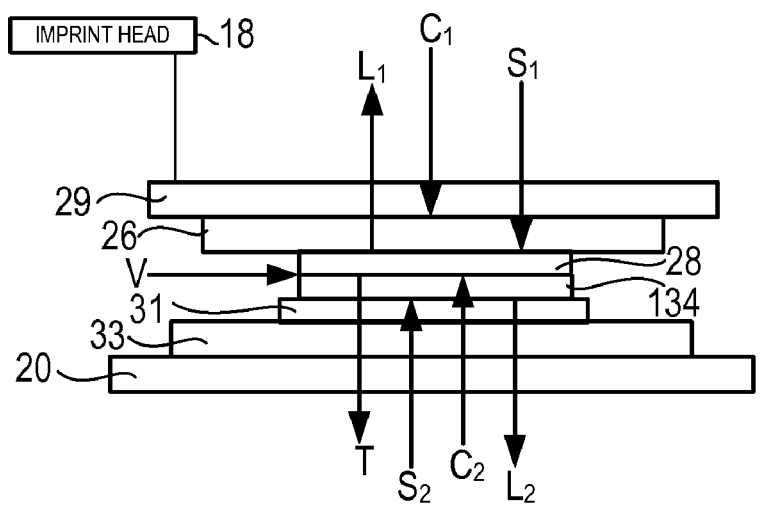
FIG. 14 is a detailed view of the system shown in FIG. 1.

Referring to FIG. 14, in a further embodiment, template chuck 29 would apply pulling force $L_1$ to attenuate, if not nullify, compressive forces $C_1$ and $C_2$. Alternatively, substrate chuck 33 would generate pulling force $L_2$ to attenuate, if not nullify, compressive forces $C_1$ and $C_2$ or imprint head 18 and motion stage 20 could move in conjunction with one another to attenuate or nullify forces $C_1$ and $C_2$. In a similar fashion, template chuck 29 could apply pushing force $S_1$ to attenuate, if not nullify, tension force T and/or substrate chuck 33 would generate pulling force $L_2$ to attenuate, if not nullify, tension force T. In this manner, the magnitude of tensile and/or compressive forces may be controlled as desired in order to maximize imprinting layer 134 thickness uniformity while still obtaining a desired distance d.

Figure 8:
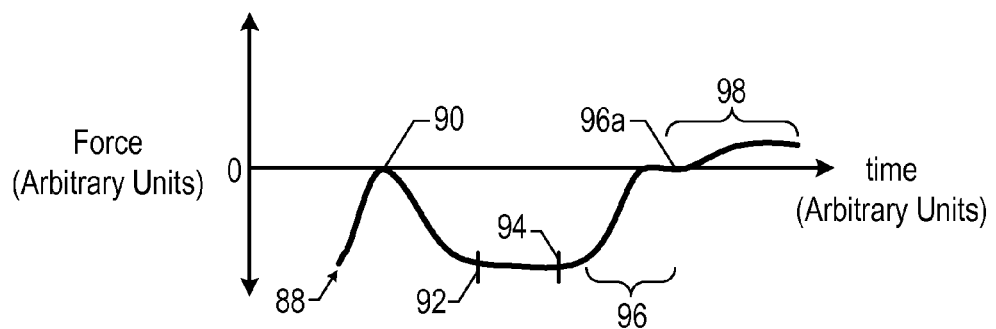
FIG. 8 is a graphical representation of the forces to which a mold, shown in FIG. 2 is subjected during imprinting processes in accordance with an alternate embodiment of the present invention.

Referring to FIGS. 2 and 8, force measurements on mold 28 during an exemplary capillary imprint method employed to maximize thickness uniformity is shown with point 88 wherein droplets 36 are initially contact with mold. As shown, the compressive and tensile forces to which mold 28 is subjected are substantially zero. At point 90, capillary filling of volume V is initiated so that mold 28 is subjected to tension force T. A point 92, tension force T has reached a maximum magnitude. At point 94, substantially all of imprinting material 36a in volume V has undergone capillary attraction with mold 28, i.e. volume V is substantially filled with imprinting material 36a. In region 96 either pulling force $L_1$ or pulling force $L_2$ or a combination thereof is applied to mold 28, thereby reducing the forces to which the same is subjected to substantially zero at point 96a. Were pushing force $S_1$ employed, mold 28 may be subjected to compressive force $C_2$ that is shown as region 98.

Figure 9:
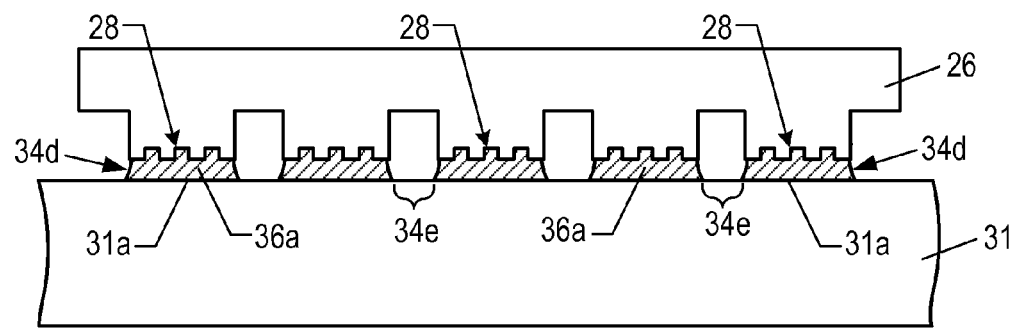
FIG. 9 is a close-up view of the template, shown in FIG. 1, having multiple molds formed thereon, shown in FIG. 2, to concurrently imprint multiple pattern regions on the substrate in accordance with the present invention.

Referring to FIGS. 5 and 9, many benefits result from the negative imprint force, including rapid and complete filling of the features of mold 28, such as recessions 28a, as well as precise control of the distribution of the conformable imprinting material 36a of the substrate 31. Additionally negative imprint forces facilitate control of the distribution of imprinting material 36a, shown in FIG. 3, on substrate 31.

As a result, template 26 may be provided with a plurality of molds 28 so that multiple discrete patterns may be formed on substrate 31, concurrently. Relying on capillary attraction between imprinting material 36a and/or mold 28 and substrate 31, imprinting material 36a does not extend between adjacent patterned areas 31a on substrate 31. Rather, imprinting material 36a remains confined within a region of substrate 31 that is in superimposition with one of the molds 28. As seen, imprinting material 36a forms a meniscus 34d at the periphery of mold 28 due to the surface tension of imprinting material 36a. A hiatus 34e is present between adjacent patterned areas 31a. The surface tension associated with imprinting material 36a in meniscus 34d substantially reduces the probability that imprinting material 36a will extend through hiatus 34e.

Figure 10:
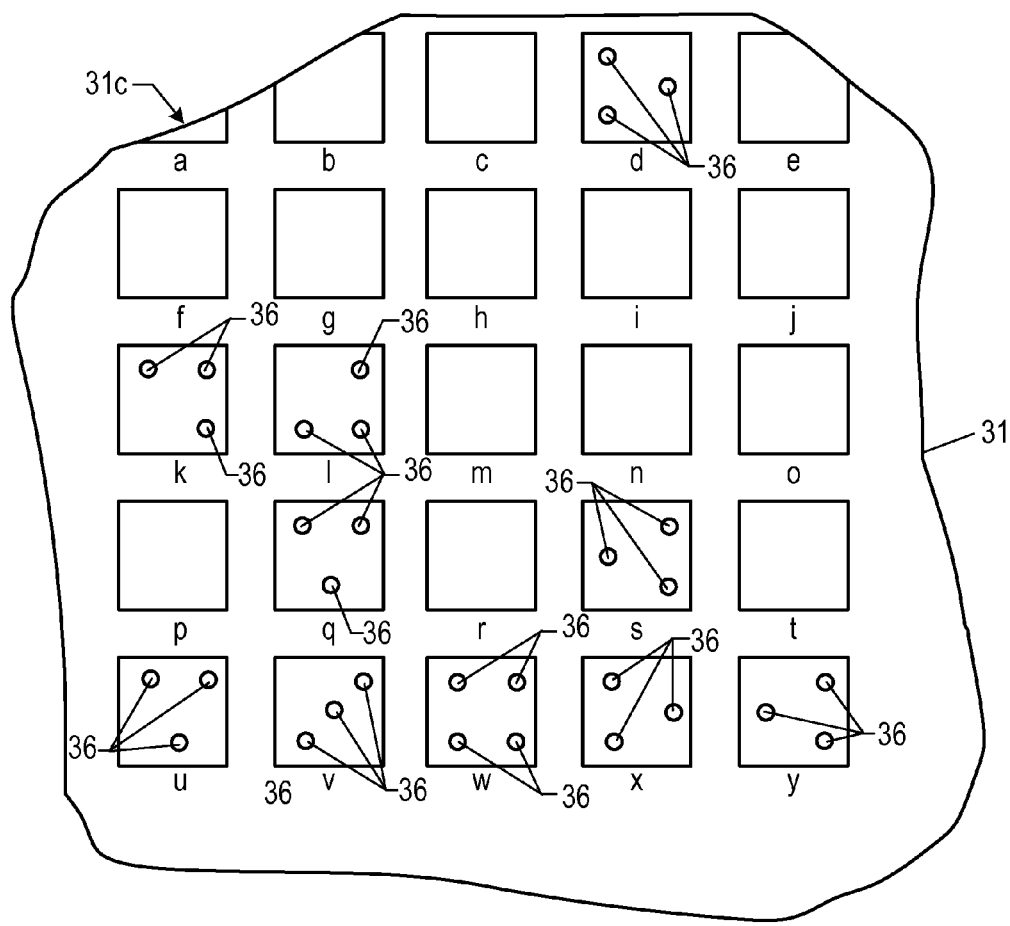
FIG. 10 is a top down plan view of a portion of the substrate, shown in FIG. 1, showing a plurality of regions that are in superimposition with the molds of template, shown in FIG. 9, in accordance with the present invention.
Figure 11:
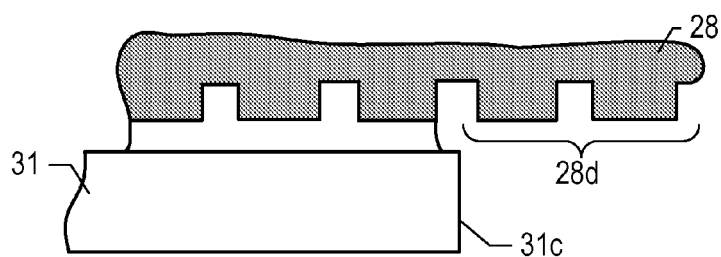
FIG. 11 is a detailed side view showing a portion of the mold, shown in FIG. 2, extending from an edge of the substrate, in accordance with an alternate embodiment of the present invention.

Referring to FIGS. 2, 10 and 11, taking advantage of the surface tension associated with meniscus 34d, additional flexibility with the distribution of droplets 36 on substrate 31 is provided. For example, assuming that template 26 includes multiple molds 28 in superimposition with a plurality of regions, shown as a-y on substrate 31. It is not necessary to create patterned areas 31 a in each of the plurality of regions a-y. Rather, a sub-portion of regions a-y may be provided with droplets 36 of imprinting material 36a, shown in FIG. 3, shown as d, k, l, q, s and u-y. In this manner, after contact with molds 28 on template 26 and subsequent formation of sub-portions 34a therein, only a sub-portion of regions a-y would be patterned areas 31a. This is beneficial for increasing the useful real estate of substrate 31. As the capillary forces exist between both the surface of mold 28 and the area of the region of substrate 31 in superimposition therewith, patterning may occur at an edge 31 c of substrate 31. The absence of substrate 31 in a sub-part 28d of mold 28 extending beyond substrate 31 prevents imprinting material 36a from sub-part 28d, shown more clearly in FIG. 11.

To facilitate filling of volume V, which includes recessions 28a, imprinting material 36a is provided with the requisite properties to completely fill recessions 28a while covering surface 32 with a contiguous formation of imprinting material 36a. In the present embodiment, sub-portions 34b, shown in FIG. 5, of imprinting layer 34 in superimposition with protrusions 28b remain after the desired distance, "d", has been reached, leaving sub-portions 34a with thickness $t_1$, and sub-portions 34b with thickness, $t_2$. Thicknesses "$t_1$" and "$t_2$" may be any thickness desired, dependent upon the application. Typically, $t_1$ is selected so as to be no greater than twice the width u of sub-portions 34a, i.e., $t_1 \leq 2u$, shown more clearly in FIG. 5.

Referring to FIG. 5, additional processing may be employed to complete the patterning of substrate 31. For example, substrate 31 and imprinting layer 134 may be etched to transfer the pattern of imprinting layer 134 into substrate 31, providing a patterned surface (not shown). To facilitate etching, the material from which imprinting layer 134 is formed may be varied to define a relative etch rate with respect to substrate 31, as desired.

To that end, imprinting layer 134 may be provided with an etch differential with respect to photo-resist material (not shown) selectively disposed thereon. The photo-resist material (not shown) may be provided to further pattern imprinting layer 134, using known techniques. Any etch process may be employed, dependent upon the etch rate desired and the underlying constituents that form substrate 31 and imprinting layer 134. Exemplary etch processes may include plasma etching, reactive ion etching, chemical wet etching and the like.

Referring to both FIGS. 1 and 2, an exemplary radiation source 22 may produce ultraviolet radiation; however, any known radiation source may be employed. The selection of radiation employed to initiate the polymerization of the material in imprinting layer 34 is known to one skilled in the art and typically depends on the specific application which is desired. Furthermore, the plurality of features on mold 28 are shown as recessions 28a extending along a direction parallel to protrusions 28b that provide a cross-section of mold 28 with a shape of a battlement. However, recessions 28a and protrusions 28b may correspond to virtually any feature required to create an integrated circuit and may be as small as a few tens of nanometers.

Referring to FIGS. 1, 2 and 5, the pattern produced by the present patterning technique may be transferred into substrate 31 to provide features having aspect ratios as great as 30:1. To that end, one embodiment of mold 28 has recessions 28a defining an aspect ratio in a range of 1:1 to 10:1. Specifically, protrusions 28b have a width $W_1$ in a range of about 10 nm to about 5000 μm, and recessions 28a have a width $W_2$ in a range of 10 nm to about 5000 μm. As a result, mold 28 and/or template 26, may be formed from various conventional materials, such as, but not limited to, fused-silica, quartz, silicon, organic polymers, siloxane polymers, borosilicate glass, fluorocarbon polymers, metal, hardened sapphire and the like.

Referring to FIGS. 1, 2 and 3, the characteristics of imprinting material 36a are important to efficiently pattern substrate 31 in light of the unique deposition process employed. As mentioned above, imprinting material 36a is deposited on substrate 31 as a plurality of discrete and spaced-apart droplets 36. The combined volume of droplets 36 is such that imprinting material 36a is distributed appropriately over an area of surface 32 where imprinting layer 34 is to be formed. As a result, imprinting layer 34 is spread and patterned concurrently, with the pattern being subsequently set into imprinting layer 34 by exposure to radiation, such as ultraviolet radiation. As a result of the deposition process, it is desired that imprinting material 36a have certain characteristics to facilitate rapid and even spreading of imprinting material 36a in droplets 36 over surface 32 so that all thicknesses $t_1$ are substantially uniform and all thicknesses $t_2$ are substantially uniform. The desirable characteristics include having a low viscosity, e.g., in a range of 0.5 to 5 centepoise (csp), as well as the ability to wet surface of substrate 31 and/or mold 28 and to avoid subsequent pit or hole formation after polymerization. With these characteristics satisfied, imprinting layer 34 may be made sufficiently thin while avoiding formation of pits or holes in the thinner regions, such as sub-portions 34b, shown in FIG. 5.

The constituent components that form imprinting material 36a to provide the aforementioned characteristics may differ. This results from substrate 31 being formed from a number of different materials. As a result, the chemical composition of surface 32 varies dependent upon the material from which substrate 31 is formed. For example, substrate 31 may be formed from silicon, plastics, gallium arsenide, mercury telluride, and composites thereof. Additionally, substrate 31 may include one or more layers in sub-portion 34b, e.g., dielectric layer, metal layer, semiconductor layer, planarization layer and the like.

Referring to FIGS. 1, 2 and 3, an exemplary composition for imprinting material 36a is as follows:

COMPOSITION isobornyl acrylate
n-hexyl acrylate
ethylene glycol diacrylate
2-hydroxy-2-methyl-1-phenyl-propan-1-one In an exemplary composition, isobornyl acrylate comprises approximately 55% of the composition, n-hexyl acrylate comprises approximately 27%, ethylene glycol diacrylate comprises approximately 15% and the initiator 2-hydroxy-2-methyl-1-phenyl-propan-1-one comprises approximately 3%. The initiator is sold under the trade name DAROCUR® 1173 by CIBA® of Tarrytown, N.Y. The above-identified composition also includes stabilizers that are well known in the chemical art to increase the operational life of the composition. To provide suitable release properties, COMPOSITION is typically employed with a template treated to have a mold surface that is hydrophobic and/or low surface energy, i.e. an a priori release layer.

Figure 12:
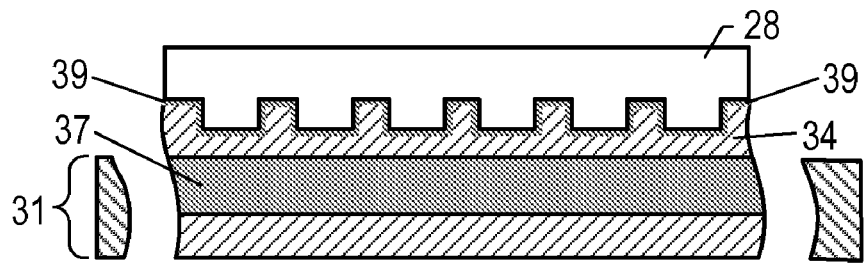
FIG. 12 is a simplified elevation view of material in an imprint device and substrate employed with the present invention in accordance with an alternate embodiment.

Referring to FIGS. 2 and 9, the above-described imprinting technique may be implemented on substrate 31 that includes a planarization layer 37, shown in FIG. 12. The primary function of planarization layer 37 is to ensure that the surface of substrate 31 is smooth, if not, planar. To that end, planarization layer 37 may be formed from a number of differing materials, such as, for example, thermoset polymers, thermoplastic polymers, polyepoxies, polyamides, polyurethanes, polycarbonates, polyesters, and combinations thereof. Planarization layer 37 is fabricated in such a manner so as to possess a continuous, smooth, relatively defect-free surface that may exhibit excellent adhesion to imprinting layer 34.

Additionally, to ensure that imprinting layer 34 does not adhere to mold 28, the surface of mold 28 may be treated with a modifying agent. As a result, imprinting layer 34 is located between planarization layer 37 and the modifying agent. One such modifying agent is a release layer 39, shown in FIG. 12.

Release layer 39 and other surface modifying agents, may be applied using any known process. For example, processing techniques may include chemical vapor deposition, physical vapor deposition, atomic layer deposition or various other techniques, brazing and the like. Exemplary release layers are found in U.S. Pat. No. 7,452,574 and U.S. application Ser. No. 10/375,832, both of which are assigned to assignee of the present invention and are incorporated by reference herein.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A method of patterning a substrate with a template having a mold, the method comprising:
    positioning the template such that a first part of the mold is in superimposition with the substrate and a second part of the mold extends beyond an edge of the substrate;
    positioning conformable material between the substrate and the first part of the mold;
    filling a volume defined between the first part of the mold and the substrate with the conformable material while restricting movement of the conformable material beyond the edge of the substrate through capillary action between the conformable material and one of the mold or the substrate; and
    applying a pulling force on at least one of the mold or the substrate to compensate for tensile forces upon the mold associated with the capillary action.

2. The method of claim 1 wherein the pulling force is applied by at least one of a substrate chuck coupled to the substrate and a template chuck coupled to the template.

3. The method of claim 1 wherein the positioning conformable material further includes depositing the conformable material on the substrate.

4. The method of claim 3 wherein the filling the volume further includes establishing a distance between the template and the conformable material to allow a sub-section of the template to contact the conformable material while minimizing the variances in the distance to attenuate creation of compressive forces between the mold and the conformable material.

5. The method of claim 1 further including solidifying the conformable material.

6. The method of claim 5 wherein applying the pulling force further includes maximizing a thickness uniformity of the solidified conformable material.

7. The method of claim 6 wherein the pulling force is applied prior to solidifying the conformable material.

8. A method of patterning a substrate with a template having a mold, the method comprising:
    positioning the template such that a first part of the mold is in superimposition with the substrate and a second part of the mold extends beyond an edge of the substrate;
    positioning conformable material between the substrate and the first part of the mold;
    filling a volume defined between the first part of the mold and the substrate with the conformable material while restricting movement of the conformable material beyond the edge of the substrate through capillary action between the conformable material and one of the mold or the substrate; and
    applying a pulling force on at least one of the mold or the substrate to compensate for tensile forces and compressive forces upon the mold associated with the capillary action, the pulling force minimizing the magnitude of tensile forces and compressive forces on the mold.

9. The method of claim 8 wherein the pulling force is applied by at least one of a substrate chuck coupled to the substrate and a template chuck coupled to the template.

10. The method of claim 8 wherein the positioning conformable material further includes depositing the conformable material on the substrate.

11. The method of claim 10 wherein the filling the volume further includes establishing a distance between the template and the conformable material to allow a sub-section of the template to contact the conformable material while minimizing the variances in the distance to attenuate creation of compressive forces between the mold and the conformable material.

12. The method of claim 8 further comprising applying a pushing force on at least one of the substrate and the mold to compensate for tensile forces and compressive forces.

13. The method of claim 12 wherein applying the pulling force and applying the pushing force minimizes tensile and compressive forces upon the mold.

14. The method of claim 13 wherein applying the pulling force and applying the pushing force minimizes tensile forces and compressive forces upon the mold to substantially zero.

15. The method of claim 12 further including solidifying the conformable material and wherein applying the pulling force and applying the pushing force further includes maximizing a thickness uniformity of the solidified conformable material.

16. The method of claim 13 wherein the pulling force and the pushing force are applied prior to solidifying the conformable material.

17. A method of patterning a substrate with a template having a mold, the method comprising:
    positioning the template such that a first part of the mold is in superimposition with the substrate and a second part of the mold extends beyond an edge of the substrate;
    positioning conformable material between the substrate and the first part of the mold;
    filling a volume defined between the first part of the mold and the substrate with the conformable material while restricting movement of the conformable material beyond the edge of the substrate through capillary action between the conformable material and one of the mold or the substrate; and
    applying at least one of a pulling force and a pushing force on at least one of the mold or the substrate to compensate for tensile forces and compressive forces upon the mold associated with the capillary action, wherein applying the at least one of the pulling force and pushing force minimizes tensile and compressive forces upon the mold.

* * * * *